United States Patent [19]

Iafrate et al.

[11] Patent Number: 4,821,093

[45] Date of Patent: Apr. 11, 1989

[54] DUAL CHANNEL HIGH ELECTRON MOBILITY FIELD EFFECT TRANSISTOR

[75] Inventors: Gerald J. Iafrate, Toms River; Louis C. Poli, Hazlet; Thomas Aucoin, Ocean; Linda S. Heath, W. Long Beach, all of N.J.

[73] Assignee: The United States of America as represented by the Secretary of the Army, Washington, D.C.

[21] Appl. No.: 228,795

[22] Filed: Jul. 29, 1988

Related U.S. Application Data

[63] Continuation of Ser. No. 900,128, Aug. 18, 1986, abandoned.

[51] Int. Cl.[4] .............................................. H01L 29/80
[52] U.S. Cl. ........................................ 357/22; 357/16; 357/55; 357/56; 357/58; 357/53
[58] Field of Search ................. 357/22 A, 22 MD, 16, 357/55, 56, 53, 58

[56] References Cited

U.S. PATENT DOCUMENTS

| | | | |
|---|---|---|---|
| 4,538,165 | 8/1985 | Chang et al. | 357/15 X |
| 4,593,300 | 6/1986 | Shur | 357/22 |
| 4,688,061 | 8/1987 | Sakaki | 357/16 X |

FOREIGN PATENT DOCUMENTS

| | | | |
|---|---|---|---|
| 59-25275 | 2/1984 | Japan | 357/22 MD |
| 59-86268 | 5/1984 | Japan | 357/22 MD |
| 60-149169 | 8/1985 | Japan | 357/22 MD |
| 60-263471 | 12/1985 | Japan | 357/22 MD |

OTHER PUBLICATIONS

Dingle, "New High-Speed III-V Devices for Integrated Circuits," *IEEE Transactions on Electron Devices*, vol. ED-31, No. 11, Nov. 1984, pp. 1662–1667.
Morkoc et al., "The HEMT: A Superfast Transistor," *IEEE Spectrum*, Feb. 1984, pp. 28–35.
Sakaki, "Velocity-Modulation Transistor (VMT)-A New Field-Effect Transistor Concept," *Japanese Journal of Applied Physics*, vol. 21, No. 6, Jun. 1982, pp. 2381–2382.
A New Field-Effect Transistor with Selectively Doped GaAs/n-Al$_x$Ga$_{1-x}$As Heterojunctions, T. Mimura, et al., *Japanese Journal of Applied Physics*, vol. 19, No. 5, May 1980, pp. 1225–1227.

*Primary Examiner*—Andrew J. James
*Assistant Examiner*—William A. Mintel
*Attorney, Agent, or Firm*—Sheldon Kanars; Maurice W. Ryan

[57] ABSTRACT

A multi-terminal Group III-V semiconductor high electron mobility field effect transistor comprised of a sandwich of molecular beam epitaxially grown layers and including two high mobility charge flow channels in respective two dimensional electron gas regions implemented, for example, by at least one doped layer of aluminum gallium arsenide adjacent an undoped gallium arsenide layer separated by a heterojunction. A pair of opposing two dimensional electron gas (2DEG) regions are generated in the layer of undoped gallium arsenide by the bending of the energy levels of the semiconductor materials. Charge flow occurs in a unidirectional fashion from one channel to the other in the common undoped gallium arsenide layer under the control of an electric field applied transversely through the structure by means of a top gate electrode and a bottom field plate electrode. Alternatively, the source voltage can be increased until the requisite amount of energy has been provided for the electrons to become "hot" enough to transfer from one channel to the other, in which case a lower biasing contact is not required. Relatively high signal isolation is inherently provided thereby between a pair of output terminals or signal ports. The device, moreover, is operable as a high speed signal coupler, amplifier, mixer as well as a photoelectric detector/amplifier.

32 Claims, 3 Drawing Sheets 4,821,093

DUAL CHANNEL HIGH ELECTRON MOBILITY FIELD EFFECT TRANSISTOR

ORIGIN OF THE INVENTION

The invention described herein may be manufactured and used by or for the Government for governmental purposes without the payment of any royalties thereon or therefor.

This application is a continuation of application Ser. No. 900,128, filed 8-18-86, now abandoned.

BACKGROUND OF THE INVENTION

This invention relates generally to semiconductor devices and more particularly to high electron mobility field effect transistors, also known as modulation doped field effect transistors.

A relatively new heterostructure exhibiting great operational speed has appeared in the field of transistor technology. The device is currently known by several different names, including: high electron mobility transistor (HEMT), high electron mobility field effect transistor (HEMFET), modulation doped field effect transistors (MODFET), and two dimensional electron gas field effect transistor (TEGFET). The device is generally characterized by the combination of doped aluminum gallium arsenide (AlGaAs) on undoped gallium arsenide (GaAs) separated by a heterojunction. This causes a quasi two-dimensional electron gas (2DEG) to be produced and confined to the small band-gap side of the heterointerface. Charge carriers, i.e. electrons, are introduced into the structure by the higher band-gap material aluminum gallium arsenide, whereupon they then diffuse to the lower band-gap material gallium arsenide where they are confined by the energy barrier at the heterojunction. Since the gallium arsenide layer is not doped, very high electron mobility and large electron velocities at very small values is permitted. Control of the charge, i.e. electron flow, between two electrodes called the source and drain is provided by an intermediate Schottky barrier electrode, called a gate electrode, which is placed on the doped gallium arsenide layer or is recessed and placed on the doped aluminum gallium arsenide layer. This device has been described in much greater detail in an article entitled, "The HEMT: A Superfast Transistor", by H. Morkoc, et al. in the *IEEE Spectrum*, February, 1984, at pp. 28–35. This publication, moreover, is meant to be incorporated herein by reference.

It is an object of the present invention, therefore, to provide a new and improved semiconductor device.

It is another object of the invention to provide an improvement in field effect transistors.

It is yet another object of the invention to provide an improvement in ultra high speed field effect transistors.

Still a further object of the invention is to provide an improvement in high electron mobility field effect transistors.

SUMMARY

Briefly, the foregoing and other objects of the invention are provided by a dual channel high electron mobility field effect transistor comprised of a Group III–V heterostructure having aluminum gallium arsenide ($Al_xGa_{1-x}As$) layers, one of which at least comprises a doped layer, located on opposite sides of an undoped layer of gallium arsenide (GaAs) and in which there is generated two spaced apart, e.g. mutually opposing two dimensional electron gas (2DEG) regions which permit conductive channels between respective source and drain electrodes to be provided and controlled by respective gate electrodes. The gate electrodes comprise a first electrode on the upper outer surface of the transistor structure between first source and drain electrodes while the second gate electrode comprises a field plate on the back or under surface of the transistor structure intermediate or spanning second source and drain electrodes. The application of an electric potential between the upper gate electrode and the lower field plate forms an electrical E-field through the undoped gallium arsenide layer transversely to the two 2DEGs causing space charge to transfer therebetween in a unidirectional fashion. Alternatively, the voltage applied to the source can be increased until sufficient energy has been imparted to the carriers so that they become "hot" enough to transfer from one channel to the other, thereby obviating the need for the second gate electrode.

BRIEF DESCRIPTION OF THE DRAWINGS

While the present invention is defined in the claims annexed to and forming a part of the specification, a better understanding can be had by reference to the following description when taken in conjunction with the accompanying drawings in which:

DETAILED DESCRIPTION OF THE INVENTION

Figure 1:
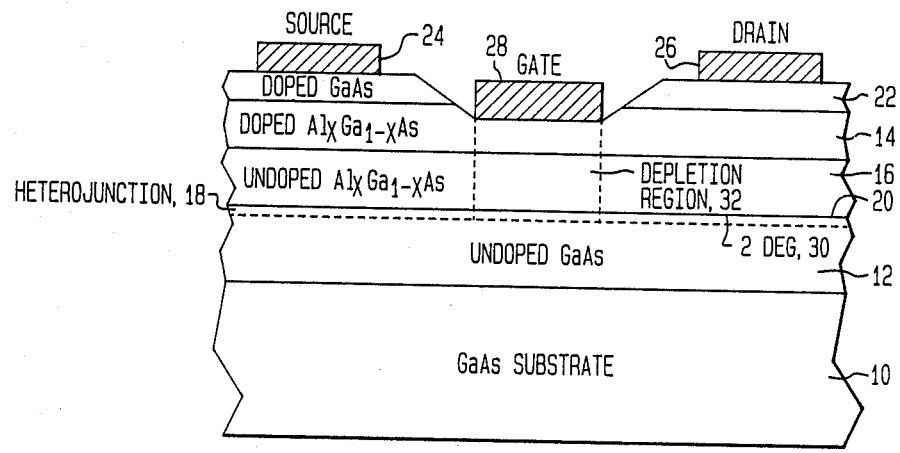
FIG. 1 is a diagrammatical cross-sectional view illustrative of a typical high electron mobility field effect transistor in accordance with the known prior art.

Prior to considering the preferred embodiments of this invention, reference will first be made to FIG. 1 where there is disclosed a heterostructure comprising a high electron mobility field effect transistor according to the known prior art. As shown, the device comprises an epilayer structure formed, for example, by known molecular beam epitaxy (MBE) techniques on a semi-insulating gallium arsenide (GaAs) substrate 10. An undoped GaAs layer 12 is grown over the substrate followed by at least one layer 14 of aluminum gallium arsenide ($Al_xGa_{1-x}As$), hereinafter simply referred to as AlGaAs, which is doped to provide a source of charge carriers such as free electrons. While not essential, an undoped AlGaAs layer 16 is normally placed between the undoped GaAs layer 12 and the doped AlGaAs layer 14 in order to prevent electrons from diffusing back into the doped AlGaAs. A heterojunction 18 is formed at the interface 20 between the undoped GaAs layer 12 and the undoped AlGaAs layer 14. A layer 22 of highly doped GaAs is thereafter formed on the upper surface of the doped AlGaAs layer 14 to facilitate the formation of ohmic contacts thereon. Two areas of metallization 24 and 26 are formed on the GaAs layer 22 for fabricating contacts defining source and drain electrodes, respectively. A third contact 28, defining a gate electrode, is formed between the source and drain electrodes 24 and 26 by removing a portion of the undoped GaAs layer 22 and fabricating the gate metallization into the doped AlGaAs layer 14.

In operation, electrons are introduced into the structure in the higher bandgap material of AlGaAs layer 14 where they diffuse through the undoped AlGaAs layer 16 to the lower bandgap material of the undoped GaAs layer 12. The electric field which arises from the charge transfer across the heterojunction 18 bends the energy bands in such a way as to confine the electrons to the region 30 on the GaAs side of the interface 20 forming what has been defined as a two dimentional electron gas region (2DEG). The region directly beneath the gate 28 forms into a depletion region which extends into the 2DEG 30, preventing charge flow from occurring in a channel of the 2DEG 30 between the source 24 and drain 26. This condition is defined as the off condition and the gate electrode 28 is at the same potential as the source 24. When, however, a voltage is applied to the gate 28 and is raised above the source voltage, the built-in voltage of the heterojunction 18 forces the depletion region 32 back into the AlGaAs layer 16. The electron gas is no longer depleted and channel conduction (electron flow) between source and drain takes place. When desirable, the depletion mode can be realized when the gate electrode partially depletes the conduction region and a negative voltage is applied to shut off the current.

The device of FIG. 1 is referred to as a heterostructure because it is comprised of two different material systems, undoped GaAs and doped AlGaAs, in the same continuous crystal structure. It should be noted, however, that material systems other than GaAs and AlGaAs can be utilized. They include other materials selected from Group III and V elements of the periodic table. Two typical examples include indium phosphide and indium antimonide. The device is fabricated in accordance with known molecular beam epitaxy (MBE) technology and permits fabrication of switching devices which not only exhibit speeds in the picosecond range, but they are also capable of acting as analog amplifiers at frequencies up to 110 Gigahertz.

Figure 2:
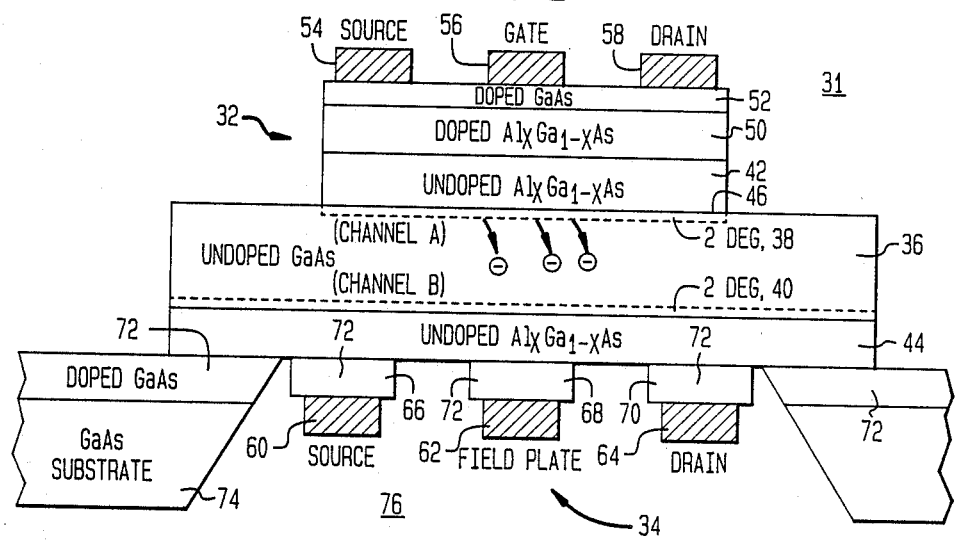
FIGS. 2, 3 and 4 are diagrammatical cross-sectional views of the preferred embodiments of the subject invention.

Referring now to the embodiments of the subject invention, reference will now be made to FIG. 2 where there is disclosed a first embodiment 31 of a dual high electron mobility field effect transistor structure fabricated on a semi-insulating GaAs substrate. As shown in FIG. 2, a dual structure including an upper and lower HEMFET section 32 and 34 share a common undoped layer of GaAs 36 wherein there is formed a pair of mutually opposing 2DEG regions 38 and 40 which underlie a pair of undoped AlGaAs layers 42 and 44 at heterojunction interfaces 46 and 48. A highly doped layer of AlGaAs 50 is formed on the upper surface of the undoped AlGaAs layer 42 and provides a source of charge carriers (electrons) which initially diffuse through the undoped AlGaAs layer 42 across the heterojunction at the interface 46 to form the 2DEG region 38. The undoped AlGaAs layer 42 comprises a spacer layer to prevent electrons from going back into the doped AlGaAs layer 50 above it. As in the prior art, a highly doped GaAs layer 52 is formed on the outer surface of the doped AlGaAs layer 50. This permits the easy or relatively easy formation of contacts 54, and 58 which define the source, and drain electrodes, respectively. When desirable, the gate contact 56 can extend through the layer 52 to the doped AlGaAs layer 50 in the same manner as shown in FIG. 1.

The section 34 on the underside or backside of the epilayer structure 31 includes not only the undoped GaAs layer 36, the undoped AlGaAs layer 44, but also a set of contacts 60, 62 and 64 which are formed on etched mesas 66, 68 and 70 of a highly doped GaAs layer 72 which has been initially grown on a semi-insulating GaAs substrate 74 in which there is formed a relatively large via opening 76. The contacts 60 and 64 define source, field plate and drain electrodes which are analogous to the source, gate and drain electrodes, respectively, of the upper or front HEMFET section 32. Under certain conditions, as will be explained subsequently, the field plate contact or electrode can be eliminated.

When desirable, the lower or back HEMFET section 34 can also include a doped AlGaAs layer, not shown, intermediate the undoped AlGaAs layer 44 and the doped GaAs layer 72 to provide a substantially identical structure as that of the upper HEMFET section 32. The layers 72, 44, 36, 42, 50 and 52 are sequentially grown by known molecular beam epitaxy (MBE) techniques on the GaAs substrate 74. The via opening 76 is etched through the back side of the resulting wafer so that the contacts 60, 62 and 64 can be fabricated by metal deposition. The surface contours of the top side topology as shown in FIG. 2 are typically configured by well known etching techniques followed by the deposition of the contacts.

In operation, the mismatch of energy bands between the AlGaAs layer 42 and the adjoining undoped GaAs layer 36 creates the 2DEG region 38. As is well known, in this region electrons can reach high velocities compared to electron travel through doped material. Electrons also diffuse from the doped AlGaAs layer 50 into a second 2DEG region 40 at heterojunction interface 48. When desirable, the undoped layer 42 can be deleted and electrons can be made injected from a corresponding doped AlGaAs layer, with contacts 60 and 64 being suitably biased. Both the upper and lower gate and field plate contacts 56 and 62 serve a two fold function, namely to act as a Schottky barrier gate and to act as top and bottom field plate terminals, respectively, for setting up a perpendicular E-field through the composite structure 31.

Upon placing a suitable bias across the source and drain electrodes 54 and 58 and connecting a negative bias to the top gate 56 with the lower gate or field plate 62 being connected to a point of reference potential, e.g. ground, the doped layer 50 is depleted and a conducting channel A is formed in the 2DEG region 38. The force exerted by the E-field through the composite structure will also start to displace charge from channel A into the underlying 2DEG region 40. A bias placed between the lower source and drain electrodes 60 and 64 will cause a conducting channel B to be formed which will indicate the presence of charge transfer. It should be noted, however, that if sufficient voltage is or can be applied to the source electrode 54, the electrons will become "hot" due to their increased energy and will readily translate from channel A to channel B without the need for the E-field and consequently the lower field plate electrode 62.

Furthermore, if the bias applied to the top gate 56 is increased, the depletion region under the gate 56 will descend to the 2DEG region 38 and channel A conduction to the drain 58 will be cut off and substantially all the charge from channel A will be transferred to channel B in the 2DEG region 40. The HEMFET device 31 now becomes a switch if the E-field applied across the gate and back plate electrodes 56 and 62 is so modulated. Since the electron charge flow in the device sown in FIG. 2 is from left to right, i.e. from source to drain, the charge transfer between channels A and B is also in this direction. This unidirectional charge transfer characteristic not only attenuates signal reflections, but also provides high isolation between the upper and lower sets of electrodes. Possible applications are disclosed in FIGS. 6, 7 and 8 and will be considered subsequently.

It should be noted with respect to the embodiment shown in FIG. 2, the outer AlGaAs layers, i.e. layers 42 and 44 contiguous to the intermediate undoped GaAs layer 36 are matching layers, i.e. undoped layers of AlGaAs. This provides matching heterojunctions 46 and 48 and accordingly matching operating characteristics. Thus, when desirable, one may employ an additional doped AlGaAs layer, not shown, between the underlying layers 44 and 72.

Although various combinations of doped and undoped AlGaAs layers can be employed, the essential components of a HEMFET device in accordance with the invention are at least two layers of AlGaAs, one of which acts as a source of charge carriers, i.e. electrons, and one undoped layer of GaAs for the two channels A and B. In FIG. 2, this is provided for by the doped AlGaAs layer 50, the undoped AlGaAs layer 44, and the undoped GaAs layer 36 with the intermediate undoped AlGaAs layer 42 acting as a spacer layer.

Figure 3:
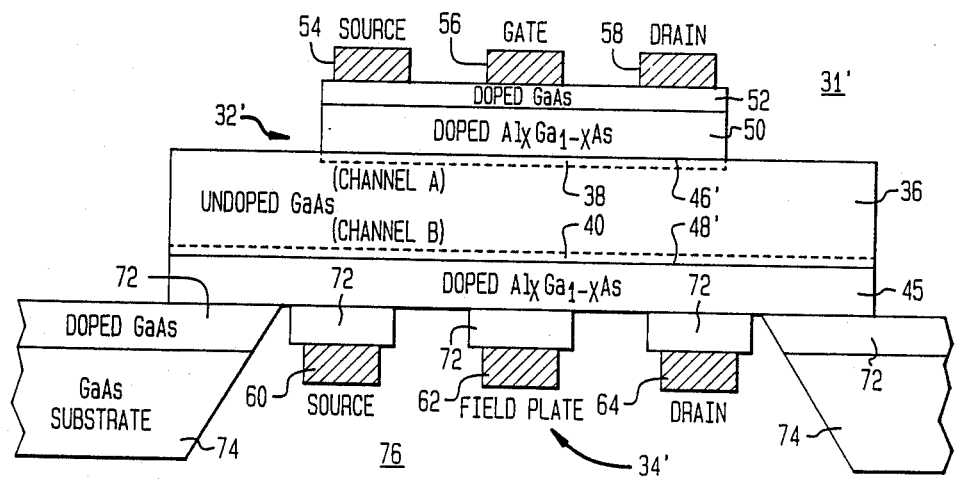

Accordingly, the undoped AlGaAs layer 42 can be deleted in favor of a structure 31' as shown in FIG. 3 where the doped AlGaAs layer 50 is now contiguous to the upper surface of the undoped GaAs layer 36 a heterojunction is formed at the interface 46', giving rise to the 2DEG region 38, as before. In order to provide energy bandgap symmetry, the embodiment of FIG. 3 includes a doped AlGaAs layer 45 in place of the undoped AlGaAs layer 44 of FIG. 2, causing a heterojunction to be formed at the interface 48' and giving rise to the second 2DEG region 40. In all other respects, the embodiment shown in FIG. 3 is the same as that shown in FIG. 2, but now comprising modified upper and lower HEMFET sections 32' and 34'. When desirable, an undoped layer of AlGaAs can be substituted for the doped layer 45.

Figure 4:
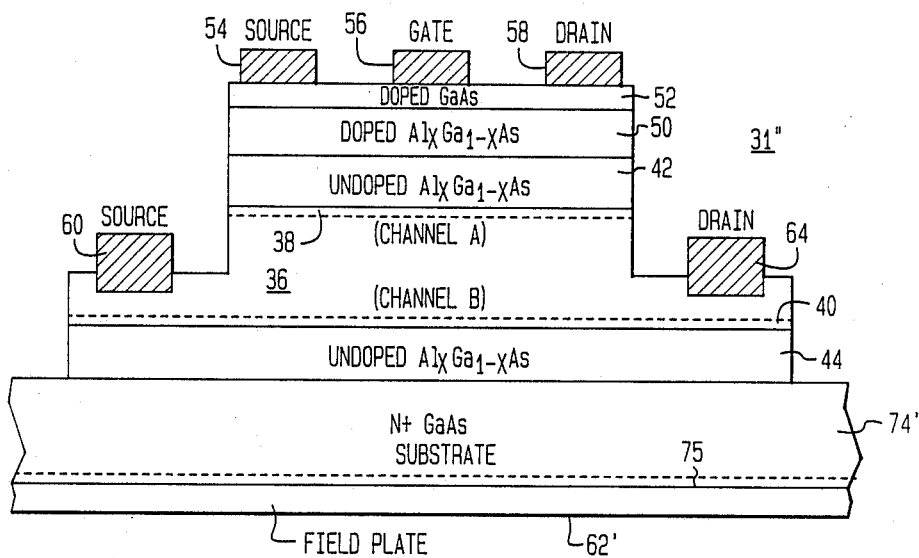

Referring now to FIG. 4, there is shown a third embodiment 31" of the invention which comprises an essentially top or front sided structure which is equivalent to the double sided configurations of FIGS. 2 and 3. What the structure of FIG. 4 realizes is the placement of the second set of source and drain contacts 60 and 64 on either side of the mesa structure including contacts 54, 56 and 58 and which extend down into the undoped GaAs layer 36, while fabricating the gate electrode therefor as a field plate metallization layer 62' formed on the back side or under surface 75 of a doped GaAs substrate 74'. Such a structure again generates a pair of two 2DEG regions 38 and 40 in the undoped GaAs layer 36 adjacent undoped AlGaAs layers 42 and 46 as shown in FIG. 2, with the source of carriers being provided by the doped AlGaAs layer 50 contiguous with the undoped AlGaAs layer 42.

The structure of FIG. 4 results from a more simplified processing scheme while realizing essentially the same structure as shown in FIG. 2, again realizing that various combinations of doped and undoped AlGaAs layers can be utilized. The chief processing advantage gained in the fabrication of this structure is the fabrication of the source and drain ohmic contacts 60 and 64 for channel B on the front side of layer 36. This avoids a relatively difficult rear side photolithography masking step required to form the back side electrodes of FIGS. 2 and 3. Because a relatively simple etching step is required to create the mesa of layers 52, 50 and 42, which is ended in the undoped GaAs layer 36, it will confine the 2DEG region 38 i.e. channel A, to within the boundaries underlying it as shown. This permits the channel B source and drain contacts 60 and 64 to freely and exclusively contact its respective 2DEG region 40.

The substrate 74' comprises a highly conductive N+ GaAs substrate in order to facilitate the fabrication of the contact layer 62' thereon which forms the electrode. The only relatively difficult feature in fabricating the configuration of FIG. 4 is fabrication of the source and drain contacts on the undoped GaAs layer 36. Fabrication of contacts upon these materials has been found to be more difficult than upon typically doped GaAs; however, recent experience in technology enhancement in this area indicates that good contacts can nevertheless be made.

Figure 5A:
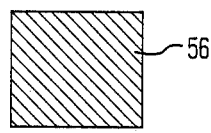
FIGS. 5A and 5B are top planar views of a typical gate electrode and a photoconductive gate electrode, respectively.
Figure 5B:
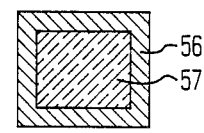

Because the HEMFET comprises a device which is known to exhibit photoelectric properties, this characteristic can be used to advantage as a photoelectric detector which will be considered subsequently with respect to FIG. 7. Accordingly, while FIG. 5A is illustrative of a typical area of gate metallization 56 utilized in connection with the embodiments of FIGS. 2 through 4, when desirable, the gate electrode 56 can be modified as shown in FIG. 5B to include a transparent window 57 which will permit the coupling of incident light energy to the underlying Schottky barrier which is utilized to control the depletion layer controlling channel conduction in the 2DEG regions 38 and 40.

Figure 6:
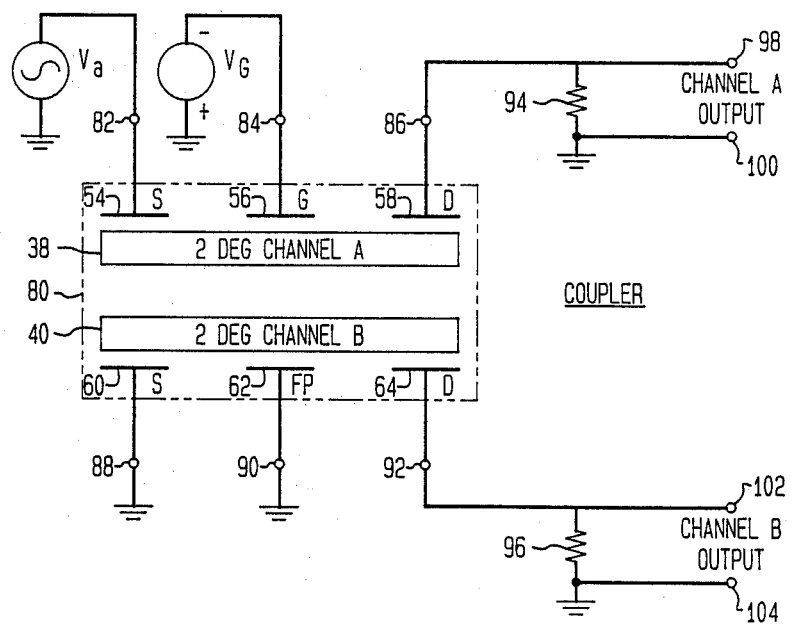
FIG. 6 is an electrical schematic diagram illustrative of a high speed coupler utilizing the embodiments of the subject invention.
Figure 7:
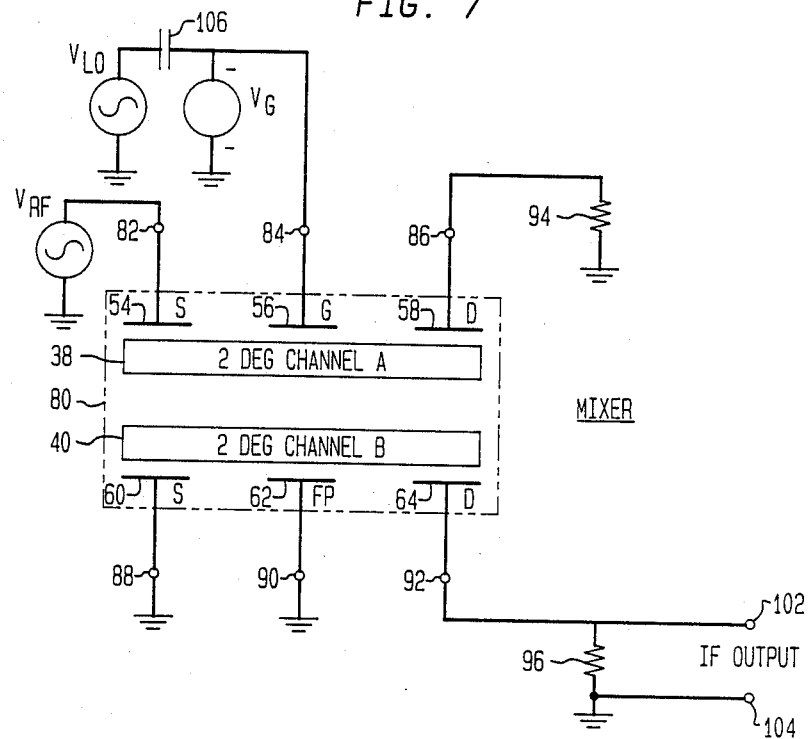
FIG. 7 is an electrical schematic diagram illustrative of an active signal mixer utilizing the embodiments of the subject invention.
Figure 8:
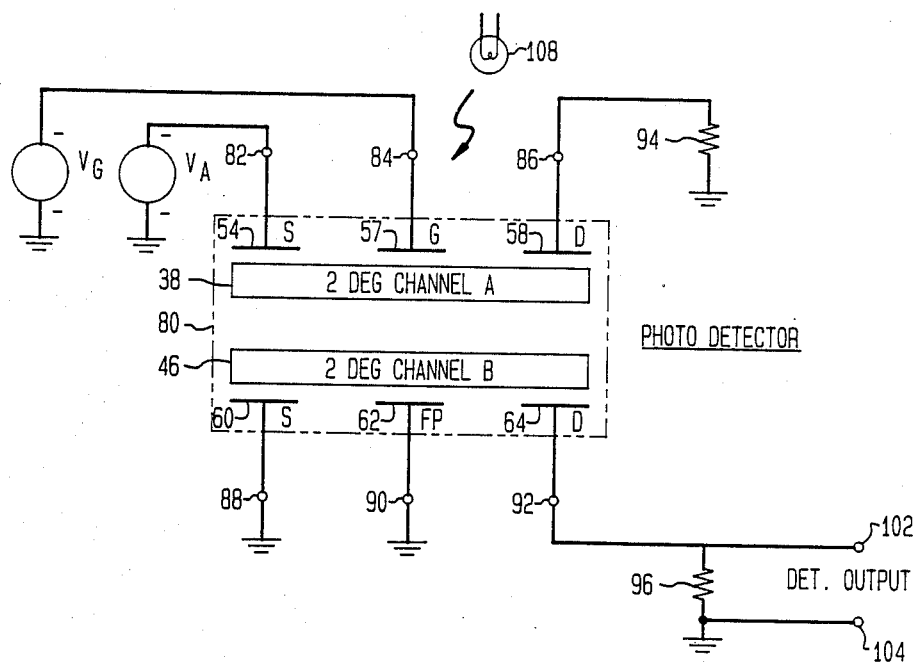
FIG. 8 is an electrical schematic diagram illustrative of a photoelectric detector and amplifier utilizing the embodiments of the subject invention.

This now leads to a consideration of FIGS. 6 through 8 where there is disclosed three uses to which the invention may be put.

The first and most obvious use is that of a high speed signal coupler or switch. This is shown in the configuration of FIG. 6. Referring now to FIG. 6, the first set of source, gate and drain electrodes 54, 56 and 58 of the six terminal HEMFET structure 31 in accordance with the invention are connected to signal ports 82, 84 and 86 while the second set of source, gate and drain electrodes 60, 62 and 64 are connected to signal ports 88, 90 and 92. A four port device is shown in FIG. 6 wherein a $V_a$ signal source 94 is coupled to port 82 while port 88 is grounded. A gate bias source $V_g$ is coupled across ports 88 and 90, causing an E-field to be developed transversely across the 2DEG channels A and B, causing charge transfer between the 2DEG regions 38 and 40. This in turn causes a signal output to be available at the ports 86 and 92, which can be sensed by the voltage appearing across the respective load resistors 94 and 96 and output terminals 98, 100 and 102, 104, respectively. If significant negative $V_G$ bias is placed upon the gate 56, then channel A will cut off and an output signal would appear at the channel B output port 92 only. Thus the device 31 operates as a power splitter or switch performing in functionally the same manner as known passive microwave power splitters or active devices arranged in a suitable power splitter configuration. What makes the device particularly useful is its ability to dynamically vary the output from channel A to channel B at high speed and its ability to act as a gate bias voltage controlled attenuator.

If the dual channel HEMFET device 80 as shown in FIG. 6 is biased for gain, then the device can provide a dual amplified signal output at both output ports 86 and 92 with isolation between channels A and B. Another important aspect of the invention is that the E-field induced space charge transfer between channels A and B will under certain conditions exhibit a negative impedance characteristic which if the device is embedded within a suitable circuit configuration, oscillations will occur in the EHF frequency region. Furthermore, if the gate bias $V_g$ is modulated, AM and FM modulation will occur on the output carrier. The device thus becomes an EHF oscillator with the added capacity of self modulation.

Referring now to FIG. 7, an active signal mixer is disclosed wherein channel A is driven by an RF source $V_{RF}$ coupled to port 82 with the gate 56 being coupled to a local oscillator signal from a source $V_{LO}$ coupled to port 84 via the coupling capacitor 104 along with the gate bias potential $V_g$. If the gate bias $V_g$ is chosen so as to make the charge transfer from channel A to channel B, a non-linear function of gate bias excursions around the bias point caused by the local oscillator will occur and mixing will occur. An IF frequency signal will now appear at port 92 which can be sensed across the load impedance 96 by terminals 102 and 104. In this instance, load impedance 94 coupled to port 86 merely acts as a termination for channel A. If the dual channel HEMFET device 31 is biased to provide gain as well as a non-linear transfer function, then a mixer configuration with gain will obtain.

Considering now FIG. 8, there is shown a photodetector configuration implemented using a dual channel HEMFET device 31 in accordance with this invention. There the gate metallization coupled to port 84 includes a very thin optically transparent window 57 (FIG. 5B). By applying bias potentials $V_a$ and $V_g$ to ports 82 and 84, respectively, upon illumination from a source shown by reference numeral 108, photons produce an increased charge at the Schottky barrier underlying the gate 56 which influences the E-field and hence the charge transfer between channels A and B. Upon proper biasing, an output signal will appear at port 92, for example, which can be sensed across the load or resistor 96 to which the output terminals 102 and 104 are connected.

Thus what has been shown and disclosed is a dual channel HEMFET structure providing two independent channels of two 2DEGs separated by an undoped region of GaAs. Since most discrete active circuit elements have very poor input to output port isolation, the unidirectional nature of charge transfer from channel A to channel B in accordance with the inventive device of this invention provides high signal isolation. Since the prior art HEMFET devices are basically two port devices, the device according to the subject invention is able to operate as up to a four port signal processing element providing thereby greater flexibility and circuit design. Furthermore, by designing the device of this invention to amplify or oscillate in the EHF region, it will provide one of the very limited number of devices available to circuit designers for this purpose. Since an optical detector, moreover, is capable of being implemented by providing a minor fabrication change in the gate metallization, it makes the device even more valuable. Accordingly, the dual channel HEMFET device of this invention is operable to minimize the problem of channel isolation, i.e. cross talk as well as providing isolation between the ports while offering great flexibility in its application, particularly as it applies to high speed signal processing and digital switching.

Having thus shown and described what is at present considered to be the preferred embodiments of the invention, it should be known that the same has been made by way of illustration and not limitation. Accordingly, all alterations, modifications and changes coming within the spirit and scope of the invention as set forth in the appended claims are herein meant to be included.

We claim:

1. A high electron mobility field effect semiconductor device, comprising, in combination:

a first body of undoped semiconductor material;

second and third bodies of semiconductor material located on opposite sides of said first body of undoped material, said second and third bodies of semiconductor material having respective energy bandgaps each greater than the energy bandgap of said first body of undoped material, and separated therefrom by respective first and second heterojunctions formed at the interfaces thereof, one of said second and third bodies of semiconductor material providing a source of charge carriers for diffusing charge carriers into said first body of material, a portion of said diffused carriers being confined at said first and second heterojunctions into respective first and second two dimensional electron gas (2 DEG) regions;

fourth and fifth bodies of semiconductor material, doped to facilitate Ohmic contact adjacent respectively said second and third bodies of semiconductor material, said fourth and fifth bodies forming respective outer layers of said device; and first and second sets of electrodes on the exterior of said device for modulating the flow of charge in respective first and second two dimensional electron gas regions underlying said sets of electrodes; said first set of electrodes having source, gate, and drain electrodes disposed upon said fourth body of semiconductor material, and said second set of electrodes having at least source and drain electrodes disposed on said fifth body of semiconductor material.

2. The device as defined in claim 1 wherein said bodies of semiconductor material are selected from Group III-V semiconductor material.

3. The device as defined by claim 2 wherein said bodies of Group III-V semiconductor material comprise epitaxial layers.

4. The device as defined by claim 1 wherein said first body of undoped semiconductor material comprises a layer of undoped first type Group III-V semiconductor material and wherein said second and third bodies of semiconductor material comprise layers of second type Group III-V semiconductor material.

5. The device as claimed by claim 4 further including a voltage of predetermined magnitude applied to one of said source electrodes of said first and second sets of electrodes for imparting sufficient energy to said charge carriers for translating from one of said two dimensional electron gas regions to the other.

6. The device as defined by claim 4 and additionally including another gate electrode between the said source and drain of said second set of electrodes, said gate electrodes of both sets being spaced apart from one another, and further including a voltage coupled across said gate electrodes for generating an electric control field through said first and second two dimensional electron gas regions for causing a controlled coupling of charge from one channel to another.

7. The device as defined by claim 4 wherein said first type material comprises gallium arsenide and said second type material comprises aluminum gallium arsenide.

8. The device as claimed in claim 4 and additionally including a layer of undoped second type semiconductor material between said second body of second type semiconductor material and said first body of undoped first type semiconductor material.

9. The device as defined by claim 4 wherein said device is formed on a semi-insulating substrate including a via opening for receiving said second set of electrodes, and wherein one of said outer layers semiconductor material is contiguous with said substrate.

10. The device as defined by claim 9 wherein said substrate and said first type semiconductor material comprise gallium arsenide and said second type semiconductor material comprises aluminum gallium arsenide.

11. The device as defined by claim 4 wherein both said layers of second type semiconductor material comprise doped layers thereof.

12. The device as defined by claim 4 wherein said second and third layers of second type semiconductor material comprises upper and lower layers respectively, and
   additionally including an upper outer layer of first or second type semiconductor material on said upper layer of second type semiconductor material;
   a lower outer layer of first or second type semiconductor material on a said lower layer of second type semiconductor material, a semi-insulating substrate contiguous to said lower outer layer and having an opening or via therein for exposing the surface of said lower outer layer;
   said first set of electrodes being formed on said upper outer layer and said second set of electrodes being formed on said exposed surface of said lower outer layer.

13. The device as defined by claim 12 and additionally including an intermediate layer of second type semiconductor material between said fourth body and said second body.

14. The device as defined by claim 4 wherein said third and second layers of second type material comprises upper and lower layers respectively, and
   additionally including a semi-insulating substrate adjacent said lower layer of said second type material, and an outer layer of first type semiconductor material on said upper layer of second type material;
   said layer of undoped first type semiconductor additionally including an exposed upper surface with said first set of electrodes being formed on the outer layer of first type semiconductor material and said pair of charge conductor electrodes of said second set of electrodes being located on either side of said first set of electrodes on said exposed upper surface of said undoped layer of first type semiconductor material and further including a control electrode in said second set of electrodes which is formed on the outer surface of said substrate.

15. The semiconductor device as defined by claim 4 wherein said first set of electrodes comprises a spaced apart source and drain electrode and an intermediate gate electrode, and wherein said pair of charge conductor electrodes of said second set of electrodes includes a source and a drain electrode, said gate electrode and said control electrodes of said second set of electrodes being operable to support electron flow in a respective channel of said two dimensional electron gas regions to and from said device.

16. The device as defined by claim 15 wherein said control electrode of said second set of electrodes comprises a field plate spanning the source and drain electrodes of said second set of electrodes and wherein said gate electrode and said field plate are located mutually opposite one another and operable to receive a potential thereacross for generating an electric control field transversely through said channels of said first and second two dimensional gas regions for causing a controlled coupling of charge from one channel to another.

17. The device as defined by claim 15 wherein said gate electrode extends into said upper layer of second type semiconductor material.

18. The semiconductor device as defined by claim 4 wherein said substrate and said first type material comprise gallium arsenide and wherein said second type material comprises aluminum gallium arsenide.

19. A dual channel high electron mobility field effect transistor comprising:
   a first layer of undoped semiconductor material;
   a second layer of doped semiconductor material, said second layer of semiconductor material having an energy bandgap greater than the energy bandgap of said first layer, said second layer located on one surface of said first layer of undoped material and separated therefrom by a first heterojunction;
   said doped layer providing a source of charge carriers which diffuse into said first layer of material, said charge carriers being confined therein in close proximity to said first heterojunction in a first two dimensional electron gas region;
   a third layer of semiconductor material, said third layer of semiconductor material having an energy bandgap greater than the energy bandgap of said first layer, located on an opposite surface of said first layer of undoped material and separated therefrom by a second heterojunction, said charge carries diffusing thereto and being confined in close proximity to said second heterojunction in a second two dimensional electron gas region;
   first and second sets of electrodes on the exterior of said transistor for modulating the flow of electrons in said transistor, said first set of electrodes having at least three electrodes and said second set of electrodes having at least two electrodes.

20. The transistor as defined by claim 19 wherein said layers of semiconductor materials are selected from Group III–V materials.

21. The device of claim 15 further including
   a voltage source connected to said source electrode of said first set;
   a bias voltage source connected to said gate electrode of said first set; and wherein said source and gate electrodes of said second set are connected to ground.

22. The device of claim 16 further including
a voltage source connected to said source electrode of said first set;
a bias voltage source connected to said gate electrode of said first set; and
wherein said source and gate electrodes of said second set are connected to ground.

23. The device of claim 17 further including
a voltage source connected to said source electrode of said first set;
a bias voltage source connected to said gate electrode of said first set; and
wherein said source and gate electrodes of said second set are connected to ground.

24. The device of claim 17 wherein at least one of said gate electrodes contains a window transparent to radiation of preselected wavelength.

25. The device of claim 16 wherein at least one of said gate electrodes contains a window transparent to radiation of preselected wavelength.

26. The device of claim 15 wherein at least one of said gate electrodes contains a window transparent to radiation of preselected wavelength.

27. The device of claim 17 further including a signal source connected to said source electrode of said first set of electrodes;
an oscillator coupled to said gate electrodes of said first set of electrodes; and
wherein said source and gate electrodes of said second set of electrodes are connected to ground.

28. The device of claim 16 further including a signal source connected to said source electrode of said first set of electrodes;
a bias voltage source connected to said gate electrode of said first set of electrodes;
an oscillator coupled to said gate electrode of said first set of electrodes; and
wherein said source and gate electrodes of said second set of electrodes are connected to ground.

29. The device of claim 15 further including a signal source connected to said source electrode of said first set of electrodes;
a bias voltage source connected to said gate electrode of said first set of electrodes;
an oscillator coupled to said gate electrode of said first set of electrodes; and
wherein said source and gate electrodes of said second set of electrodes are connected to ground.

30. The device of claim 17 further including a signal source connected to said source electrode of said first set of electrodes;
a bias voltage source connected to said gate electrode of said first set; and
wherein said source and gate electrodes of said second set of electrodes are connected to ground.

31. The device of claim 16 further including a signal source connected to said source electrode of said first set of electrodes;
a bias voltage source connected to said gate electrode of said first set; and
wherein said source and gate electrodes of said second set of electrodes are connected to ground.

32. The device of claim 15 further including a signal source connected to said source electrode of said first set of electrodes;
a bias voltage source connected to said gate electrode of said first set; and
wherein said source and gate electrodes of said second set of electrodes are connected to ground.

* * * * *